(12) United States Patent
Dallavalle

(10) Patent No.: US 6,489,800 B1
(45) Date of Patent: Dec. 3, 2002

(54) METHOD OF TESTING AN INTEGRATED CIRCUIT

(75) Inventor: Carlo Dallavalle, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 22 days.

(21) Appl. No.: 09/661,727

(22) Filed: Sep. 14, 2000

(30) Foreign Application Priority Data

Sep. 14, 1999 (EP) .............................................. 99830581

(51) Int. Cl.[7] .............................................. G01R 31/26
(52) U.S. Cl. ........................ 324/765; 324/763; 324/769; 324/158.1; 438/17; 438/18; 257/48
(58) Field of Search .............................. 324/765, 158.1, 324/769, 763; 438/17, 18; 257/48

(56) References Cited

U.S. PATENT DOCUMENTS

| 5,025,344 A | 6/1991 | Maly et al. ..................... 361/88 |
| 5,519,333 A | 5/1996 | Rughter ....................... 324/765 |
| 5,625,300 A | 4/1997 | Sachdev ....................... 324/765 |
| 5,627,477 A | 5/1997 | Kuroda et al. ............... 324/760 |
| 5,789,933 A | * 8/1998 | Brown et al. ................ 324/765 |
| 5,914,615 A | * 6/1999 | Chess .......................... 324/765 |
| 5,939,894 A | * 8/1999 | Yamauchi et al. ........... 324/765 |
| 6,239,606 B1 | * 5/2001 | Miller ......................... 324/765 |
| 6,175,244 B1 | * 1/2002 | Gattiker et al. ............. 324/765 |

FOREIGN PATENT DOCUMENTS

EP        0782187 A  *  7/1997  ....................... 27/2

* cited by examiner

*Primary Examiner*—Michael Sherry
*Assistant Examiner*—Jimmy Nguyen
(74) *Attorney, Agent, or Firm*—Lisa K. Jorgenson; E. Russell Tarleton; SEED IP Law Group PLLC

(57) ABSTRACT

A method of testing an integrated circuit that includes supplying the integrated circuit in static conditions; biasing the p-type body regions with a potential more negative than the negative pole of the supply and the n-type body regions with a potential more positive than the positive pole of the supply; setting a current threshold value; measuring the current absorbed; comparing the current measured with the threshold current; and accepting or rejecting the integrated circuit if the comparison shows that the current measured is less than or is greater than the threshold value, respectively.

15 Claims, 1 Drawing Sheet

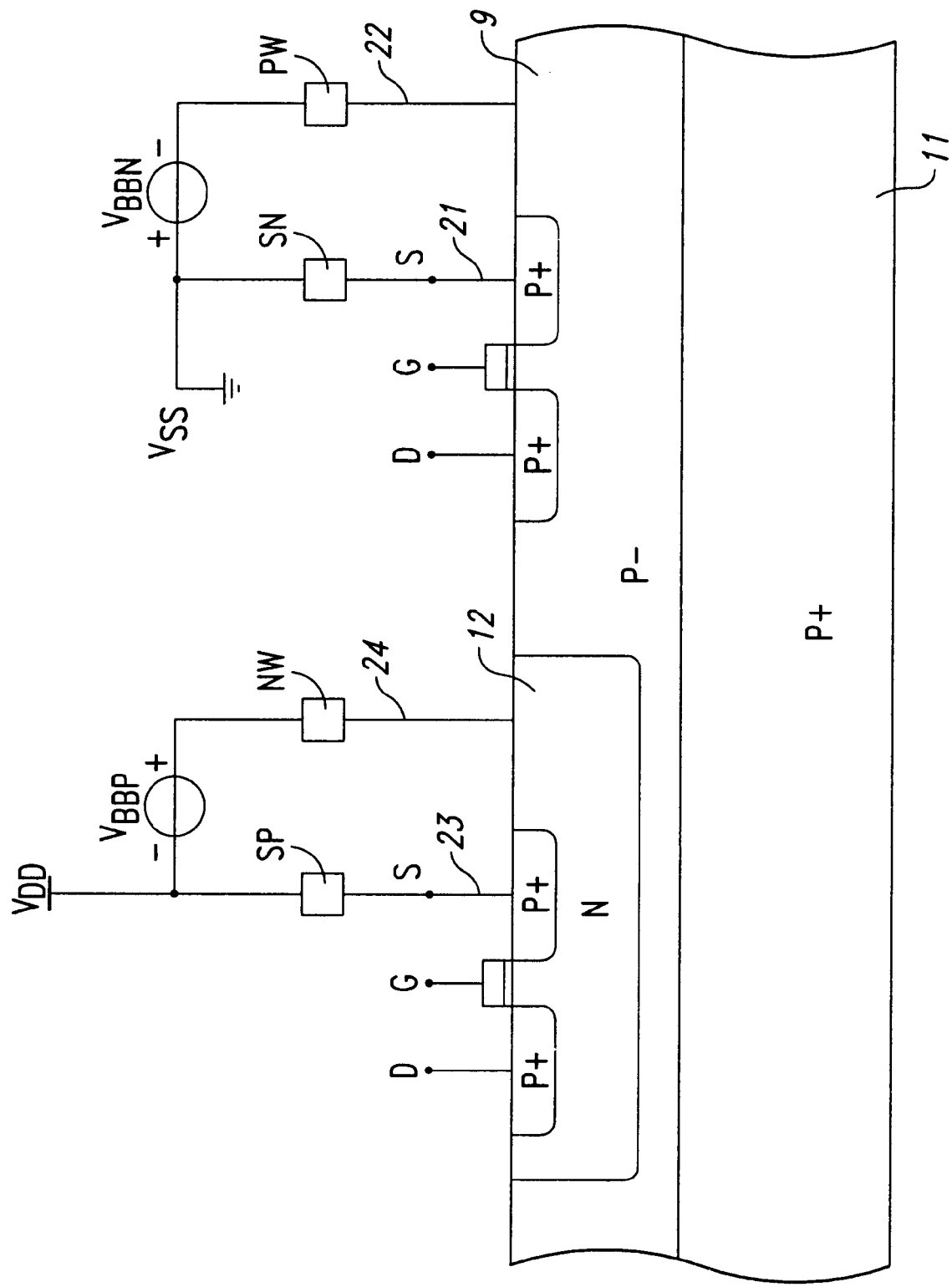

METHOD OF TESTING AN INTEGRATED CIRCUIT

TECHNICAL FIELD

The present invention relates to a method and apparatus for testing an integrated circuit, and, more particularly, to a method of measuring absorbed current of an integrated circuit in a quiescent state and a related test circuit.

BACKGROUND OF THE INVENTION

Upon completion of the process to manufacture a plurality of identical integrated circuits on a wafer of semiconductor material, even before the individual devices are separated from one another, they are subjected to final testing on the wafer (final wafer test) by suitable automatic apparatus. The test comprises various programmed electrical measurements which are intended to ascertain whether each device conforms to certain functional requirements defined at the design stage. Devices which do not satisfy all of these requirements are identified after testing so that they can be rejected after the wafer has been divided up into chips, whilst the devices which have passed the test go on to subsequent assembly and encapsulation stages.

A parameter which is the subject of one of the most significant electrical measurements in the testing of digital or mixed analog and digital integrated circuits of large dimensions produced with the use of CMOS technology is the current at rest, in static conditions, that is, the current absorbed by the integrated circuit when it is connected to the supply but is functionally inactive and in a waiting condition (stand-by mode) or when the supply is deactivated (power-down mode). This parameter is commonly indicated IDDQ, where I indicates the current, DD indicates direct-current supply, and Q indicates the "quiescent" or rest state.

The IDDQ current measured is given basically by the sum of the so-called sub-threshold currents of the MOS transistors, including those which constitute the memory cells, and of the leakage currents due to manufacturing defects or material defects. Further leakage currents of the semiconductor junctions (junction leakage currents) are at least two orders of magnitude lower and are thus negligible. If the sample subjected to testing is defective in the sense which will be explained further below, the current measured also includes a contribution resulting directly from the defect.

For each integrated circuit subjected to testing, the IDDQ current measured is compared with a threshold value Ith, which is set beforehand by examining test samples of the same device and by taking into consideration suitable tolerance margins. If the comparison shows that the IDDQ value is equal to or greater than the value Ith, the device tested is identified for subsequent rejection.

The method of measuring the IDDQ current is recognized as being very important in programs for testing CMOS integrated circuits but becomes ever more difficult to perform as the complexity of the integrated circuits increases, that is, with increases in the density of integration and in the number of logic gates, which generally indicates the degree of complexity of a digital integrated circuit. To explain this fact further, it should be borne in mind that, with the refinement of integration techniques, there has been a change, within a short time, from IDDQ currents of between 1 $\mu$A and 10 $\mu$A for integrated circuits containing 1,000–10,000 logic gates produced by 1.5–1.0 $\mu$m technology to IDDQ currents of between 100 and 10,000 $\mu$A for integrated circuits containing 100,000–10 million logic gates produced by 0.5–0.2 $\mu$m technology.

It is known that the contribution of subthreshold currents to the IDDQ current increases in proportion to the number of transistors. On the other hand, the threshold current Ith must be set in a manner such that a defective device can be identified. That is, it must be equal to the sum of the IDDQ current measured for a good device and of a current smaller than the current If due to the presence even of a single electrical defect such as a short-circuit or a floating node in the integrated circuit. Since this current If is substantially independent of the complexity of the integrated circuit, the difference between the IDDQ current measured for a good device and the current Ith is smaller, as a percentage, the greater is the number of transistors in the integrated circuit. By way of example, if the IDDQ current for a device without electrical defects is 10 $\mu$A and if the current If due to a defect is at least 50 $\mu$A, the threshold current Ith may be fixed at 60 $\mu$A, that is, six times the IDDQ of a good device. If, however, the IDDQ of a good device is 1 mA, in order not to risk accepting as good those devices which have even a single defect contributing 50 $\mu$A to the IDDQ measurement, the threshold voltage Ith must be fixed at 1.05 mA, that is, at a value which differs from the IDDQ of a good device by only a fraction thereof ($\frac{1}{20}$ in this example). In conclusion, in the first case, the difference between IDDQ and Ith is 50 $\mu$A, which is 500% of the IDDQ current to be compared and, in the second case, the difference is still 50 $\mu$A, but this is only 5% of the IDDQ current to be compared. To ensure reliable results of the measurement even for devices with a high density of integration it is therefore necessary to use ever more sensitive and hence more complex detection circuits and ever more critical measurement methods.

To prevent this problem, it has been proposed to perform the IDDQ measurements by keeping the wafer containing the integrated circuits to be tested at a temperature much lower than ambient temperature, for example −40° C. In these conditions, the sub-threshold currents are reduced whilst the leakage currents due to defects of the structure increase (because of the increased mobility of the charge-carriers at low temperatures). Although this technique is effective, it is not applicable in practice in the mass production of integrated circuits because it requires extremely expensive apparatus designed to operate at low temperature.

SUMMARY OF THE INVENTION

The embodiments of the present invention are directed to a method of measuring the IDDQ current during the testing of integrated circuits with a high density of components which requires neither particularly sensitive detector circuits nor expensive apparatus.

This is achieved by the implementation of the method defined and characterized herein.

The method is directed to testing an integrated circuit having n-channel MOS transistors in p-type body regions and p-type MOS transistors in n-type body regions, and includes setting a current threshold value; supplying the integrated circuit in static conditions with a voltage supply having a positive pole and a negative pole; performing a biasing operation by applying to the p-type body regions a voltage potential that is negative relative to the negative pole of the supply and applying to the n-type body regions a voltage potential that is positive relative to the positive pole of the supply; measuring the current absorbed by the integrated circuit and comparing the current measured with the threshold value; and accepting the integrated circuit when the comparison shows that the current measured is less than the threshold value and rejecting the integrated circuit when the comparison shows that the current measured is greater than the threshold value.

In accordance with another aspect of the foregoing, the method includes setting the current threshold value that further comprises measuring the currents absorbed by a plurality of integrated circuits of the same type as those to be tested, supplied in static conditions and subjected to the above-mentioned biasing operation; and performing a statistical analysis of the results of the measurement.

In accordance with another aspect of the present invention, an integrated circuit is provided that includes a plurality of n-channel MOS transistors having source regions connected to a first common conductive strip, p-type body regions containing the n-channel MOS transistors and connected to a second common conductive strip, p-channel MOS transistors having source regions connected to a third common conductive strip, and n-type body regions containing the p-channel MOS transistors and connected to a fourth common conductive strip, the first and third strips being connected to respective supply terminal pads, the second and fourth strips also connected to respective body biasing terminal pads.

In accordance with yet another aspect of the present invention, a method of testing a transistor is provided that includes coupling the transistor to a voltage supply; increasing the absolute value of the body potential of the transistor; measuring current absorbed by the transistor; and comparing the measured absorbed current with a current threshold value.

In accordance with yet another embodiment of the invention, a test circuit is provided that includes an integrated circuit having n-channel MOS transistors in p-type body regions and p-channel MOS transistors in n-type body regions, the n-channel MOS transistors having source regions connected to a first common conductive strip, p-type body regions containing the n-channel MOS transistors and connected to a second common conductive strip, p-channel MOS transistors having source regions connected to a third common conductive strip, and n-type body regions containing the p-channel MOS transistors and connected to a fourth common conductive strip, the first and third strips connected to respective supply terminal pads, and the second and fourth strips connected to respective body biasing terminal pads; a voltage supply coupled to the first, second, third, and fourth pads, the voltage supply configured to bias the p-type body regions and the n-type body regions to increase the absolute value of the body potential.

In accordance with another aspect of the foregoing embodiment of the invention, the test circuit includes first and second voltage supplies coupled to the first and second and the third and fourth pads, respectively, the first and second voltage supplies further configured to apply to the p-type body regions a voltage potential that is negative relative to the negative pole of the voltage supply and applying to the n-type body regions a voltage potential that is positive relative to the positive pole of the supply.

In accordance with another aspect of this embodiment of the invention, a current measuring device is provided that is coupled to the integrated circuit and configured to measure the current absorbed by the integrated circuit in a quiescent state. Ideally, a comparator is provided that is adapted to compare the measure of the absorbed current to a threshold value.

BRIEF DESCRIPTION OF THE DRAWINGS

The invention will be understood further from the following detailed description of an embodiment thereof, given by way of non-limiting example with reference to the single appended drawing in which the single drawing shows schematically a portion of an integrated circuit with connections and biasing illustrating the measurement method according to the disclosed embodiments of the invention.

DETAILED DESCRIPTION OF THE INVENTION

In a MOS or CMOS integrated circuit, the regions in which the source and drain regions of one or more transistors of the same type are formed, and which are known as body regions, may be constituted by the substrate of the integrated circuit or by regions formed suitably in the substrate. It is known that the source regions of the transistors contained in a body region are normally electrically connected to the respective body region by means of a common surface contact strip. That is, there is a single conductive track which electrically interconnects the source regions and the respective body regions of the n-channel MOS transistors. This track terminates in a terminal contact pad of the integrated circuit which is intended to be connected to the negative terminal (VSS) of a supply of the integrated circuit. Similarly, a single conductive track electrically interconnects the source regions and the respective body regions of the P-channel MOS transistors and terminates in a pad which is intended to be connected to the positive terminal (VDD) of the supply.

In order to implement the test method according to the disclosed embodiments of the invention, it is necessary to form the integrated circuit with a modified structure of the source and body connections; more precisely, separate connection tracks have to be formed for the source regions and for the body regions of both types of transistors, and each of the tracks has to terminate in a separate terminal contact pad. An integrated circuit structure formed in this manner is described, for example, in publication EP-A-0782187.

Before the wafer is divided into chips, the integrated circuits formed therein are subjected to electrical testing, individually, by means of suitable automatic apparatus. In order to perform the test according to the method of the invention, the apparatus has two additional needles for establishing the necessary contacts for the connection of the measurement apparatus to the terminal body pads, indicated NW and PW in the drawing.

The drawing shows, schematically and in section, a portion of an integrated circuit containing a pair of CMOS transistors. The integrated circuit is formed on a p-type epitaxial layer 9 with a low concentration of dopants (P−), grown on a strongly doped (P+) p-type substrate 11. An n-type region 12 formed in the layer 9 contains two strongly-doped p-type regions which constitute the source region (S) and the drain region (D) of a p-channel MOS transistor. A conductive strip, insulated from the layer 9, is disposed over the channel between the source and drain regions, and constitutes the gate electrode (G) of the transistor. The region 12 constitutes the body region of the p-channel transistor and may contain other MOS transistors of the same type. Two strongly-doped (N+) n-type regions are also formed in the layer 9 and constitute the source region (S) and the drain region (D) of an n-channel MOS transistor. A conductive strip, insulated from the layer 9 and constituting the gate electrode (G) of the transistor, is disposed over the channel between these two regions also. The layer 9 constitutes the body region of the n-channel transistor and may contain other MOS transistors of the same type.

Separate conductive strips, indicated 23 and 21, are in contact with the surfaces of the source regions of the p-channel transistors contained in the body regions 12 and in other similar body regions (not shown), and with the surfaces of the source regions of the n-channel transistors formed in the body region 9, and terminate in respective pads SP, SN of the integrated circuit. Two separate conductive strips, indicated 24 and 22, are in contact with the surface of the body region 12 and of any other body regions containing p-channel transistors, and with the surface of the body region (layer 9) of the n-channel transistors, and terminate in the respective pads NW, PW.

For electrical testing, the integrated circuit is connected to the measurement apparatus by means of needles in contact with the pads. The IDDQ measurement program provides, according to the method of the invention, for the supply of the integrated circuit in static conditions and for the application of a negative voltage between the common connection terminal of the body regions of the n-channel transistors and the negative terminal VSS (ground) of the supply, and the application of a positive voltage between the common connection terminal of the body regions of the p-channel transistors and the positive supply terminal VDD. This is represented in the drawing by the connection of a voltage source VBBN between the pad PW and the ground terminal and by the connection of a voltage source VBBP between the pad NW and the positive terminal VDD of the voltage supply. The polarities of the voltages VBBN and VBBP are such that the body potentials of both n-channel and p-channel transistors increase in absolute value. This has the effect of significantly reducing the sub-threshold currents but does not appreciably affect the leakage currents due to manufacturing defects or to material defects.

The IDDQ current measured is compared with a predetermined threshold current Ith. The threshold current is preferably determined experimentally by measuring the IDDQ current of a certain number of integrated circuits which are of the same type as those to be tested and which are supplied and biased in the same manner, by performing a statistical analysis of the results of the measurements, and by taking into consideration a suitable tolerance margin. It could, however, be determined in a different manner, for example, by computer simulation programmes or by calculation.

The integrated circuit evaluated is then accepted or is rejected if the comparison shows that the current measured is less than or is greater than the threshold value, respectively. In a practical example in which the voltage VDD was 5V and the voltages VBBP and VBBN were 1V in absolute value, the IDDQ current was found to be about three orders of magnitude smaller than the IDDQ current measured in accordance with the known method, whereas the current due to the presence of an electrical defect remained substantially unchanged. As a result, the threshold current was also set at a value which was lower by the same order of magnitude so that the current difference to be measured was much larger as a percentage. In summary, therefore, with the method according to the invention, the testing of devices which, according to the prior art, would have an IDDQ of between 100 and 10,000 $\mu$A can be performed with the same ease and reliability as the testing of devices having an IDDQ, measured according to the prior art, of between 0.1 and 10 $\mu$A.

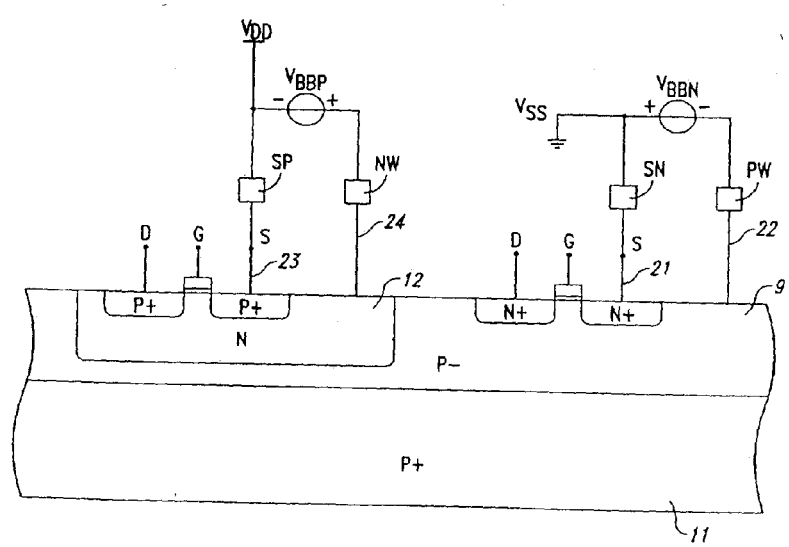

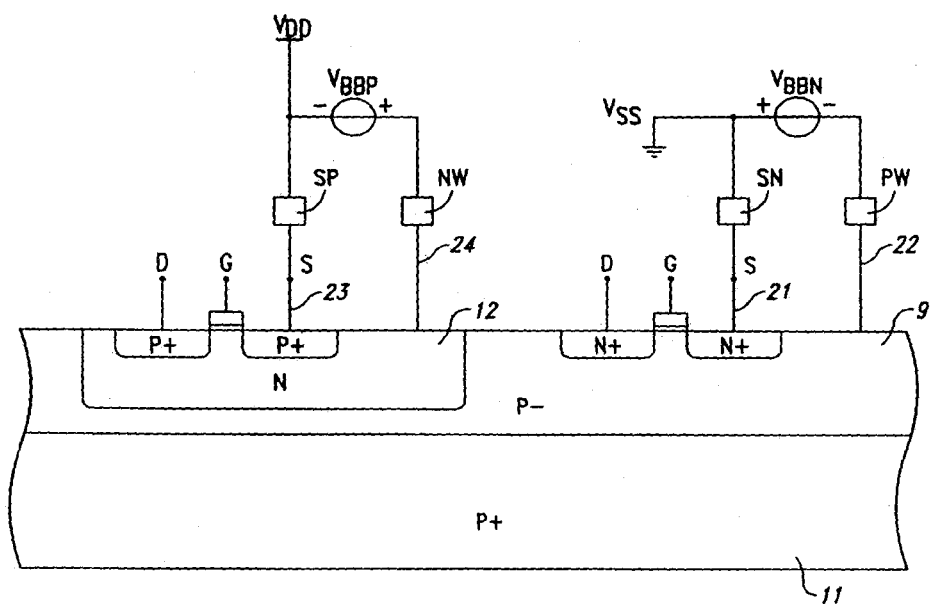

What is claimed is:

1. A method of testing a high-density integrated circuit having n-channel MOS transistors in p-type body regions and p-channel MOS transistors in n-type body regions, comprising:

setting a current threshold value;

supplying the integrated circuit in static conditions with a voltage supply having a positive pole and a negative pole;

performing a biasing operation by applying to the p-type body regions via a respective first body pad a voltage potential that is negative relative to the negative pole of the supply, and applying to the n-type body regions via a respective second body pad a voltage potential that is positive relative to the positive pole of the supply;

measuring the current absorbed by the integrated circuit at the first and second body pads;

comparing the current measured with the threshold value; and accepting the integrated circuit when the comparison shows that the current measured is less than the threshold value.

2. The test method of claim 1, in which setting a current threshold value comprises:

measuring the currents absorbed by a plurality of integrated circuits of the same type as those to be tested, supplied in static conditions, and statistical analysis of the results of the measurement.

3. The test method of claim 2, wherein measuring the currents absorbed by a plurality of integrated circuits comprises:

supplying the integrated circuits in static condition with a voltage supply having a positive pole and a negative pole;

performing a biasing operation by applying to the p-type body regions a voltage potential that is negative relative to the negative pole of the supply, and applying to the n-type body regions a voltage potential that is positive relative to the positive pole of the supply;

measuring the current absorbed by the integrated circuits; and comparing the current measured with a threshold value.

4. An integrated circuit that can be tested by the method of claim 1, comprising a plurality of n-channel MOS transistors having source regions connected to a first common conductive strip, p-type body regions containing the n-channel MOS transistors and connected to a second common conductive strip, p-channel MOS transistors having source regions connected to a third common conductive strip, and n-type body regions containing the p-channel MOS transistors and connected to a fourth common conductive strip, the first and third strips being connected to respective supply terminal pads (1, 3), the second and fourth strips connected to respective body biasing terminal pads (2, 4) adapted to be accessible by test pins of a test apparatus.

5. A method of testing a MOS transistor having a body region, the method comprising:

coupling the transistor to a voltage supply via first and second source pads;

increasing the absolute value of the body potential of the transistor via first and second body pads;

measuring current absorbed by the transistor in a quiescent state at the first and second body pads; and comparing the measured absorbed current with a current threshold value.

6. The method of claim 5, further comprising accepting the MOS transistor when the comparison shows that the current measured is less than the threshold value and rejecting the MOS transistor when the comparison shows that the current measured is greater than the threshold value.

7. The method of claim 5, comprising initially setting the current threshold value.

8. The method of claim 7, wherein setting the current threshold value comprises measuring the current absorbed by a plurality of integrated circuits.

9. The method of claim 8, wherein measuring the current absorbed by a plurality of integrated circuits comprises supplying the plurality of integrated circuits in static conditions with a voltage supply having a positive pole and a negative pole;

performing a biasing operation by applying to the p-type body regions of the plurality of integrated circuits a voltage potential that is negative relative to the negative pole of the supply, and applying to the n-type body regions of the plurality of integrated circuits a voltage potential that is positive relative to the positive pole of the supply;

measuring the current absorbed by each of the plurality of integrated circuits; and performing a statistical analysis of the results of the measurement of the current absorbed by the plurality of integrated circuits.

10. The method of claim 5, wherein increasing the absolute value of the body potential of the transistor comprises supplying the transistor in static condition with a voltage supply to perform a biasing operation on the body potential of the transistor.

11. The method of claim 10, wherein performing a biasing operation comprises in the case of a p-channel MOS transistor, applying to the n-type body region a voltage potential that is positive relative to a positive pole of the voltage supply, and in the case of an n-channel MOS transistor, applying to the p-type body region a voltage potential that is negative relative to a negative pole of the voltage supply.

12. A test circuit, comprising:

an integrated circuit comprising at least one n-channel MOS transistor having a source region connected to a first common conductive strip, a p-type body region containing the at least one n-channel MOS transistor and connected to a second common conductive strip, at least one p-channel MOS transistor having source regions connected to a third common conductive strip, and an n-type body region containing the at least one p-channel MOS transistor and connected to a fourth common conductive strip, the first and third strips connected to respective supply terminal pads, and the second and fourth strips connected to respective body biasing terminal pads;

a voltage supply coupled to the first, second, third, and fourth pads, the voltage supply configured to bias the p-type body region and the at least one n-type body region to increase the absolute value of the body potential when the at least one n-channel MOS transistor and the at least one p-channel MOS transistor are in a quiescent state.

13. The test circuit of claim 12, wherein the voltage supply comprises a first voltage supply coupled to the supply terminal pads of the first and third strips, and a second voltage supply connected to the body biasing terminal pads of the second and fourth strips, the first voltage supply configured to apply to the p-type body region a voltage potential that is negative relative to the negative pole of the first voltage supply, and the second voltage supply configured to apply to the n-type body region a voltage potential that is positive relative to a positive pole of the second voltage supply.

14. The test circuit of claim 12, further comprising a current measuring device coupled to the integrated circuit to measure the current absorbed by the integrated circuit when the absolute value of the body potentials of the at least one p-channel MOS transistor and the at least one n-channel MOS transistor are increased.

15. The test circuit of claim 14, further comprising a comparator adapted to compare the measure of the absorbed current to a threshold value.

* * * * *

UNITED STATES PATENT AND TRADEMARK OFFICE
CERTIFICATE OF CORRECTION

PATENT NO.   : 6,489,800 B1
DATED        : December 3, 2002
INVENTOR(S)  : Carlo Dallavalle It is certified that error appears in the above-identified patent and that said Letters Patent is hereby corrected as shown below:

Title page showing the illustrative figure should be deleted to be replaced with the attached title page.

Drawing sheet, consisting of Fig. 1, should be deleted to be replaced with the drawing sheet consisting of Fig. 1, as shown on the attached page.

Signed and Sealed this

Seventeenth Day of August, 2004

JON W. DUDAS
*Acting Director of the United States Patent and Trademark Office*

(12) United States Patent
Dallavalle

(10) Patent No.: US 6,489,800 B1
(45) Date of Patent: Dec. 3, 2002

(54) METHOD OF TESTING AN INTEGRATED CIRCUIT

(75) Inventor: Carlo Dallavalle, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 22 days.

(21) Appl. No.: 09/661,727

(22) Filed: Sep. 14, 2000

(30) Foreign Application Priority Data

Sep. 14, 1999 (EP) .............................................. 99830581

(51) Int. Cl.7 ............................................... G01R 31/26
(52) U.S. Cl. ........................ 324/765; 324/763; 324/769; 324/158.1; 438/17; 438/18; 257/48
(58) Field of Search .............................. 324/765, 158.1, 324/769, 763; 438/17, 18; 257/48

(56) References Cited

U.S. PATENT DOCUMENTS

| | | | |
|---|---|---|---|
| 5,025,344 A | 6/1991 | Maly et al. | 361/88 |
| 5,519,333 A | 5/1996 | Rughter | 324/765 |
| 5,625,300 A | 4/1997 | Sachdev | 324/765 |
| 5,627,477 A | 5/1997 | Kuroda et al. | 324/760 |
| 5,789,933 A * | 8/1998 | Brown et al. | 324/765 |
| 5,914,615 A * | 6/1999 | Chess | 324/765 |
| 5,939,894 A * | 8/1999 | Yamauchi et al. | 324/765 |
| 6,239,606 B1 * | 5/2001 | Miller | 324/765 |
| 6,175,244 B1 * | 1/2002 | Gattiker et al. | 324/765 |

FOREIGN PATENT DOCUMENTS

EP 0782187 A * 7/1997 ...................... 27/2

* cited by examiner

*Primary Examiner*—Michael Sherry
*Assistant Examiner*—Jimmy Nguyen
(74) *Attorney, Agent, or Firm*—Lisa K. Jorgenson; E. Russell Tarleton; SEED IP Law Group PLLC

(57) ABSTRACT

A method of testing an integrated circuit that includes supplying the integrated circuit in static conditions; biasing the p-type body regions with a potential more negative than the negative pole of the supply and the n-type body regions with a potential more positive than the positive pole of the supply; setting a current threshold value; measuring the current absorbed; comparing the current measured with the threshold current; and accepting or rejecting the integrated circuit if the comparison shows that the current measured is less than or is greater than the threshold value, respectively.

15 Claims, 1 Drawing Sheet